United States Patent
Anzaki et al.

(10) Patent No.: US 6,585,871 B1
(45) Date of Patent: Jul. 1, 2003

(54) METHOD OF FILM DEPOSITION ON SUBSTRATE SURFACE AND SUBSTRATE PRODUCED BY THE METHOD

(75) Inventors: Toshiaki Anzaki, Osaka (JP); Etsuo Ogino, Osaka (JP); Takayuki Toyoshima, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 0 days.

(21) Appl. No.: 09/553,170

(22) Filed: Apr. 20, 2000

(30) Foreign Application Priority Data

Apr. 23, 1999 (JP) ............................................. 11-116608
Feb. 15, 2000 (JP) ........................................ 2000-036550

(51) Int. Cl.$^7$ ............................................. C25B 11/02
(52) U.S. Cl. ................................. 204/298.14; 204/192.1; 204/192.12; 204/192.15; 204/298.02; 204/298.12; 204/298.13
(58) Field of Search ......................... 204/192.12, 298.06, 204/298.12, 298.14, 298.26, 192.22, 192.1, 192.15, 298.02, 298.13

(56) References Cited

U.S. PATENT DOCUMENTS

| | | | | |
|---|---|---|---|---|
| 4,606,806 A | * | 8/1986 | Helmer | 204/192.12 |
| 5,080,455 A | * | 1/1992 | King et al. | 204/192.11 |
| 5,330,632 A | * | 7/1994 | Sichmann | 204/298.09 |
| 5,611,899 A | * | 3/1997 | Maass | 204/298.08 |
| 5,620,792 A | * | 4/1997 | Challener, IV | 369/13.4 |
| 5,721,633 A | * | 2/1998 | Nagai et al. | 359/274 |
| 5,827,409 A | * | 10/1998 | Iwata et al. | 204/192.15 |
| 6,096,174 A | * | 8/2000 | Teschner et al. | 204/192.12 |
| 6,103,320 A | * | 8/2000 | Matsumoto et al. | 427/535 |

* cited by examiner

Primary Examiner—Deborah Jones
Assistant Examiner—Andrew Piziali
(74) Attorney, Agent, or Firm—Sughrue Mion, PLLC (57) ABSTRACT

A method of film deposition is disclosed, which eliminates the conventional problem that a coating film having a component concentration gradient in the thickness direction and thus having a boundary with a compositional gradient or a coating film in which two or more components coexist as a mixture thereof cannot be stably obtained by sputtering. In the method, two planar cathodes are closely arranged as a pair, and a voltage is applied thereto while alternately inverting the polarities thereof so that when a target A bonded to one of the cathodes is used as a negative electrode, then a target B bonded to the other cathode and differing to the target A in component is used as a positive electrode. The targets A and B are simultaneously bombarded with positive ions while passing a substrate in front of the targets so as to cross the cathodes. Thus, a coating film having a boundary with a compositional gradient in the thickness direction or a coating film having a two-layer structure composed of a layer of ingredient A and a layer of ingredient B is deposited by sputtering through one-direction conveyance.

3 Claims, 6 Drawing Sheets

METHOD OF FILM DEPOSITION ON SUBSTRATE SURFACE AND SUBSTRATE PRODUCED BY THE METHOD

FIELD OF THE INVENTION

The present invention relates to a method of depositing a coating film on a substrate by sputtering in a vacuum apparatus which can control a reduced pressure atmosphere.

DESCRIPTION OF THE RELATED ART

A technique has conventionally been attempted which comprises closely arranging two cathodes, disposing targets made of different materials respectively on the cathodes, and depositing a coating film comprising the materials of the targets on a substrate by sputtering. In this case, a power supply for applying a negative voltage to each cathode is used. Namely, this technique employs separate electrical circuits for the respective cathodes.

In the sputtering method described above, the glow discharges generated for sputtering target materials are not stable, i.e., an abnormal discharge generates frequently. The conventional technique hence has had a problem that a coating film having a desired thickness cannot be obtained or the coating film deposited has pinholes or adherent foreign substances.

In the technique in which targets made of different materials are disposed respectively on two cathodes arranged so as to be adjacent to each other and a coating film comprising the two target materials is to be deposited on a substrate surface, it is necessary that the cathodes should be closely arranged. In this case, the glow discharge plasmas generating on the respective target surfaces are close to each other due to the magnetic field in the magnetron. As a result, target components ejected from one target accumulate on the neighboring target surface to cover the region where the target is to be bombarded with positive ions (erosion region) with an electrical insulating film. This covering causes the glow discharge plasma to be unstable and unable to last. Namely, there has been a problem that stable and continuous film deposition becomes impossible. This problem is serious especially when an oxide coating film or a semiconductor coating film is to be deposited on a substrate, and brings about fatal results. Specifically, abnormal discharges frequently occur and glow discharges stop occasionally, making it impossible to continue coating film deposition.

The problem may be overcome by arranging two cathodes at a larger distance from each other. However, the increased distance between cathodes poses an essential problem that the target materials respectively ejected from the two targets cannot be simultaneously sputtered as a coating film.

SUMMARY OF THE INVENTION

An object of the present invention is to provide a method in which targets differing in component or composition are disposed on two closely arranged cathodes, and atoms, molecules, or particles of the materials of the targets are simultaneously accumulated on a substrate surface by sputtering with stable glow discharges to thereby deposit a coating film comprising those two materials or compositions.

The present invention has been achieved in order to eliminate the problem described above, and provides a method of film deposition on a substrate surface which comprises closely arranging a pair of cathodes in a vacuum apparatus in which an atmosphere having a reduced pressure can be prepared, applying a voltage thereto while alternately inverting the polarities thereof so that when one of the cathodes is used as a negative or positive electrode, then the other cathode is used as a positive or negative electrode, respectively, to generate glow discharges on targets respectively disposed on the two cathodes, and simultaneously bombarding the targets with positive ions resulting from the glow discharges to thereby sputter a coating film comprising the materials of the targets on a surface of a substrate, wherein the material of the target disposed on one of the cathodes differs from that of the target disposed on the other cathode and the film deposited on the substrate surface comprises both of the target materials.

In one embodiment of the method of the present invention, the cathodes as a pair are planar cathodes arranged so that the longer sides of one of the cathodes are parallel to those of the other, and the substrate is passed in front of the cathodes in such a manner as to cross the cathodes in a direction perpendicular to the direction of the longer sides of the cathodes, whereby the coating film deposited has a concentration gradient in the thickness direction with respect to the concentration of each of the different target materials.

In another embodiment of the method of the present invention, the two cathodes are arranged so that one is surrounded by the other, whereby the different target materials in the coating film deposited are present as a mixture of both.

In still another embodiment of the method of the present invention, the target materials each is a metal.

In a further embodiment of the method of the present invention, the target materials each is an electroconductive metal oxide.

DESCRIPTION OF REFERENCE NUMERALS AND SIGNS 1A, 1B: Cathode
2A: Target made of ingredient A
2B: Target made of ingredient B
3: Alternate-inversion discharge plasma 4: Substrate
5: Sputtering gas feed pipe
6: Shroud
7: Magnetron power supply
8: Oscillator
9: Substrate holder

DESCRIPTION OF THE PREFERRED EMBODIMENTS

Figure 1:
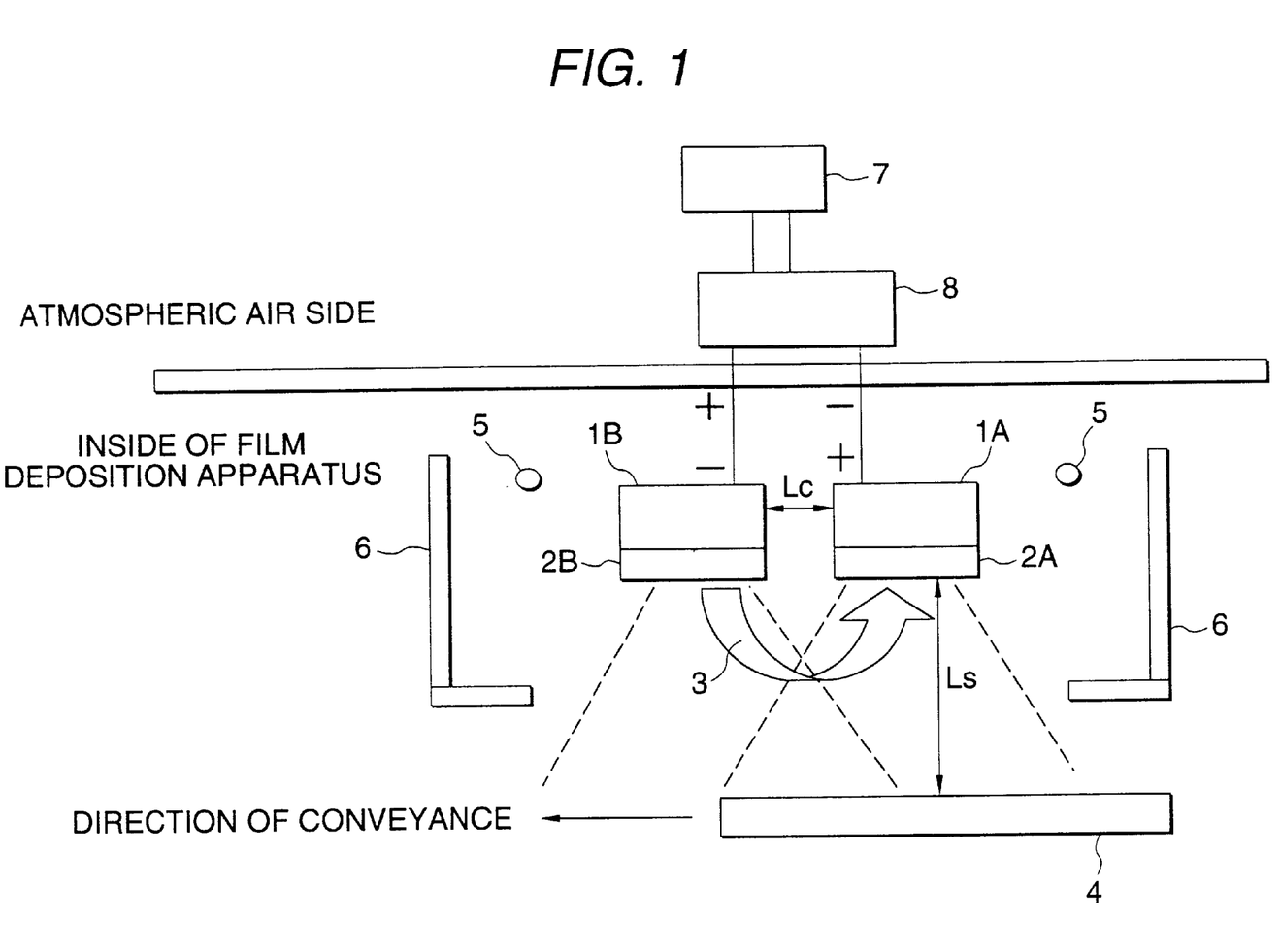
FIG. 1 is a diagrammatic sectional view illustrating one embodiment of the pair of cathodes usable in practicing the present invention.

FIG. 1 is a sectional view of important parts of one embodiment of a sputtering apparatus which can be used in practicing the method of film deposition of the present invention. In this embodiment shown in FIG. 1, planar magnetron cathodes are used. Specifically, two known magnetron cathodes 1A and 1B in each of which the side facing a substrate 4 is rectangular (directions perpendicular to the page are the longitudinal directions for the cathodes) have been arranged side by side in the sputtering apparatus. A target made of ingredient A (indicated by symbol 2A) and a target made of ingredient B (indicated by symbol 2B) have been bonded to the front sides (lower sides in the figure) of the respective cathodes. The distance Lc between the target 2A and the target 2B is suitably regulated to a relatively small value according to the minimum distance Ls between each target and the substrate and to the intended use of the substrate. From this standpoint, a preferred film deposition apparatus is one which is equipped with a mechanism capable of increasing or reducing the distance between the cathode 1A and the cathode 1B while maintaining a reduced-pressure atmosphere therein.

Argon gas or, if desired, a reactive gas such as oxygen or nitrogen is introduced into the film deposition apparatus through a gas feed pipe 5. Simultaneously therewith, the film deposition apparatus is evacuated with a vacuum pump (not shown) to regulate the chamber so as to have an atmosphere having a pressure reduced to a given degree. The pressure and gas composition in this reduced-pressure atmosphere are regulated, by means of the vacuum pump and gas introduction, so that sputtering is possible in the atmosphere.

A negative voltage is applied to the cathodes 1A and 1B with a power supply 7 to generate glow discharge plasmas on the target surfaces, whereby the target 2A (ingredient A) and the target 2B (ingredient B) are bombarded with positive ions. When the cathode 1A serves as a positive electrode, the cathode 1B serves as a negative electrode. In applying a voltage to the cathodes, use can be made of sine wave, pulse wave, or time-asymmetrical wave. Also usable is any desired waveform capable of Fourier expansion. A DC bias having a polarity common to the two cathodes may be simultaneously applied.

A shroud 6 has been attached so as to surround the two cathodes. The shroud 6 functions, for example, to hold the introduced gas around the cathodes, to prevent adhesion of particles ejected from the targets, and to regulate film thickness. Namely, the shroud serves not only to prevent the particles ejected from the cathodes from scattering but to confine the plasma to thereby regulate film thickness.

A negative voltage is applied to the cathodes 1A and 1B by means of the magnetron power supply 7 disposed on the periphery of the apparatus. In this voltage application, the polarities of the respective cathodes are alternately inverted with an oscillator (polarity converter) 8 in such a manner that when the cathode 1A is used as a negative electrode, then the cathode 1B is used as a positive electrode and when the cathode 1B is used as a negative electrode, then the cathode 1A is used as a positive electrode. When viewed momentarily, a negative voltage is applied to one of the cathodes and a positive voltage is applied to the other cathode. Thus, an alternate inversion glow discharge 3 is generated and, as a result, the targets 2A and 2B disposed on the surfaces of the two cathodes are bombarded with positive ions.

The frequency at which the polarities are inverted is preferably 100 Hz or higher, more preferably 1 kHz or higher. Frequencies lower than 100 Hz are undesirable in that the effect of removing charges from the target surfaces is reduced, resulting in an unstable discharge. The frequency of polarity inversion is preferably 1 GHz or lower, more preferably 100 kHz or lower. This is because frequencies exceeding 1 GHz result in reduced driving stability of the power supply, making it difficult to obtain a stable discharge.

The voltage to be applied may have any waveform as long as the waveform has such a positiveness/negativeness balance that the charges present on the surfaces of the two targets are neutralized with respect to the axis of time. Examples of the waveform include sine wave, rectangular pulse wave, and time-asymmetrical wave. A given DC bias component may be added to between the reference zero potential among the cathode potentials during driving and the earth potential of the sputtering apparatus.

In the present invention, the polarities of the cathodes are inverted at a frequency within the preferred range specified above, whereby the so-called cathode sputtering is conducted intermittently, when viewed microscopically, with respect to each target. However, when viewed macroscopically from the standpoint of film deposition, the target 2A and the target 2B are simultaneously bombarded with positive ions and ingredient A and ingredient B are simultaneously sputtered on the substrate, due to the selection of a polarity inversion frequency within the preferred range.

According to the present invention, the charges present on the surfaces of both targets are neutralized by the inversion potentials and inversion currents, whereby the targets are bombarded with positive ions while being destaticized. Because of this, the film deposition according to the present invention is free from the generation of an abnormal discharge (arcing, corona, etc.) which occurs, for example, due to a thermal shock produced when the charges accumulated on the surface of the deposited film cause it to suffer dielectric breakdown.

Furthermore, the glow discharge plasmas have the effect of cleaning the surfaces of the respective counter targets by sputtering. As a result, film deposition proceeds while the film which is accumulating on the erosion surface of each clean target is being removed. Because of this, the accumulation of an electrical insulating film on the erosion region surfaces of the two targets is inhibited and the so-called anode disappearance phenomenon, which is observed in the deposition of an oxide film with an ordinary single target, does not occur. Consequently, the generation of glow discharge plasmas never stops during film deposition.

In the present invention, an ingredient comprising A (hereinafter referred to as "ingredient A") and an ingredient comprising B (hereinafter referred to as "ingredient B") can be simultaneously deposited on a substrate surface either throughout the period of from the initiation of coating film deposition on the substrate surface to the termination thereof or during part of that period. As a result, the coating film can be either a film having a concentration gradient in the film thickness direction with respect to the concentration of each of ingredient A and ingredient B or a film comprising a mixture of ingredient A and ingredient B. When ingredient A and ingredient B are deposited so as to constitute a two-layer structure, the concentration gradients in the thickness direction form a boundary having a compositional gradient.

A reactive gas maybe used as a sputtering gas. If desired, the substrate may be heated to deposit a film comprising a mixture of ingredient A and ingredient B. These coating films are determined while taking account of the distance Lc between the two cathodes, minimum distance Ls between the substrate and each target, substrate conveyance speed A, sputtering rate, etc.

In depositing the mixture film, the distance Lc between the cathode 1A and the cathode 1B, shown in FIG. 1, is preferably 15 cm or shorter, more preferably 10 cm or shorter. The target 2A and the target 2B are disposed in such a state that they are electrically insulated from each other.

In depositing a two-layer coating film having a concentration gradient in the film thickness direction, e.g., having a boundary having a compositional gradient, in the present invention, the cathodes are preferably arranged at a distance Lc of from 1 mm to 150 cm. Such a coating film having a boundary having a compositional gradient can be obtained not only by the sputtering of ingredient A and ingredient B using argon gas but also by reactive sputtering using a gas containing a reactive gas such as oxygen or nitrogen. According to the present invention, a two-layer film composed of a layer of ingredient A and a layer of ingredient B can be deposited while inhibiting the boundary between these ingredients from being contaminated. Furthermore, the multilayered film can be made to have a thickness-direction continuous profile of a property.

Figure 2A:
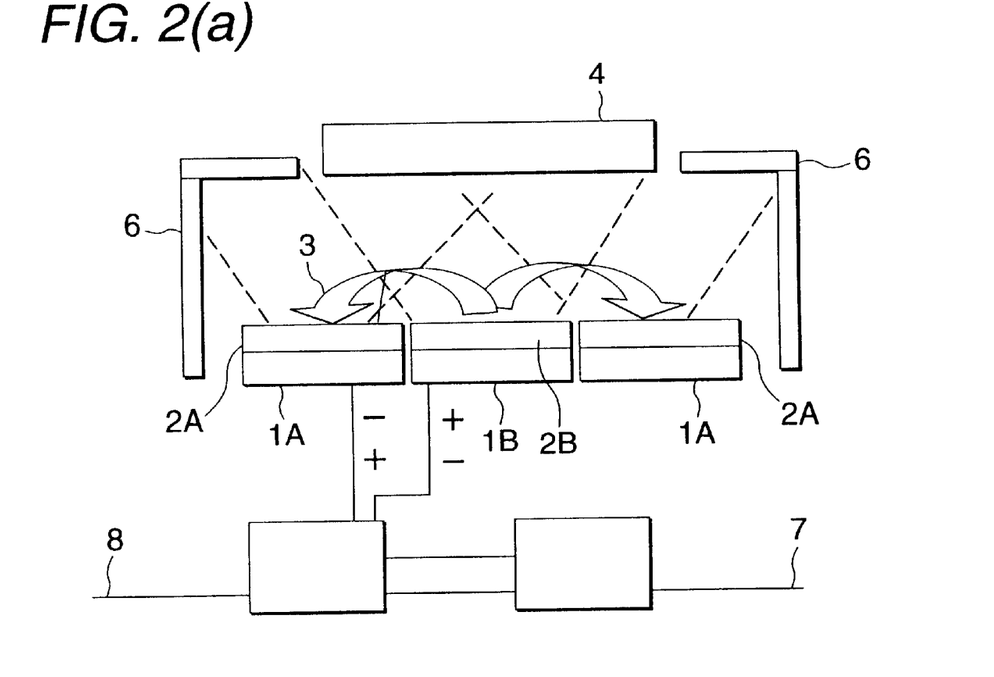
FIG. 2(a) and FIG. 2(b) are views illustrating another embodiment of the pair of cathodes usable in practicing the present invention.

FIG. 2(a) shows another embodiment of the pair of cathodes, which can be used in practicing an embodiment of the method of the present invention. The cathode pair shown in FIG. 2(a) consists of a cathode 1B which is a disk-form cathode disposed at the center and a cathode 1A which is a ring form cathode concentric with and surrounding the cathode 1B. The inner and outer cathodes each may be elliptic or rectangular. As illustrated by the sectional view in FIG. 2A, the disk-form cathode 1B are the ring-form cathode 1A are caused to undergo alternate polarity inversion and cathode sputtering.

Figure 2B:
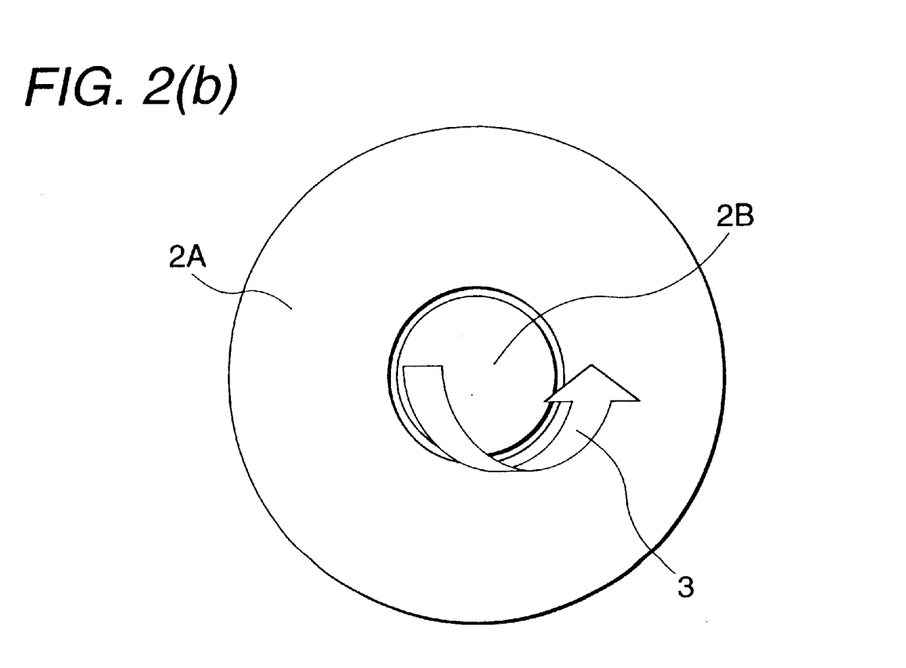

FIG. 2(b) is a view illustrating an outer ring-form target 2A and an inner disk-form target 2B.

Figure 3:
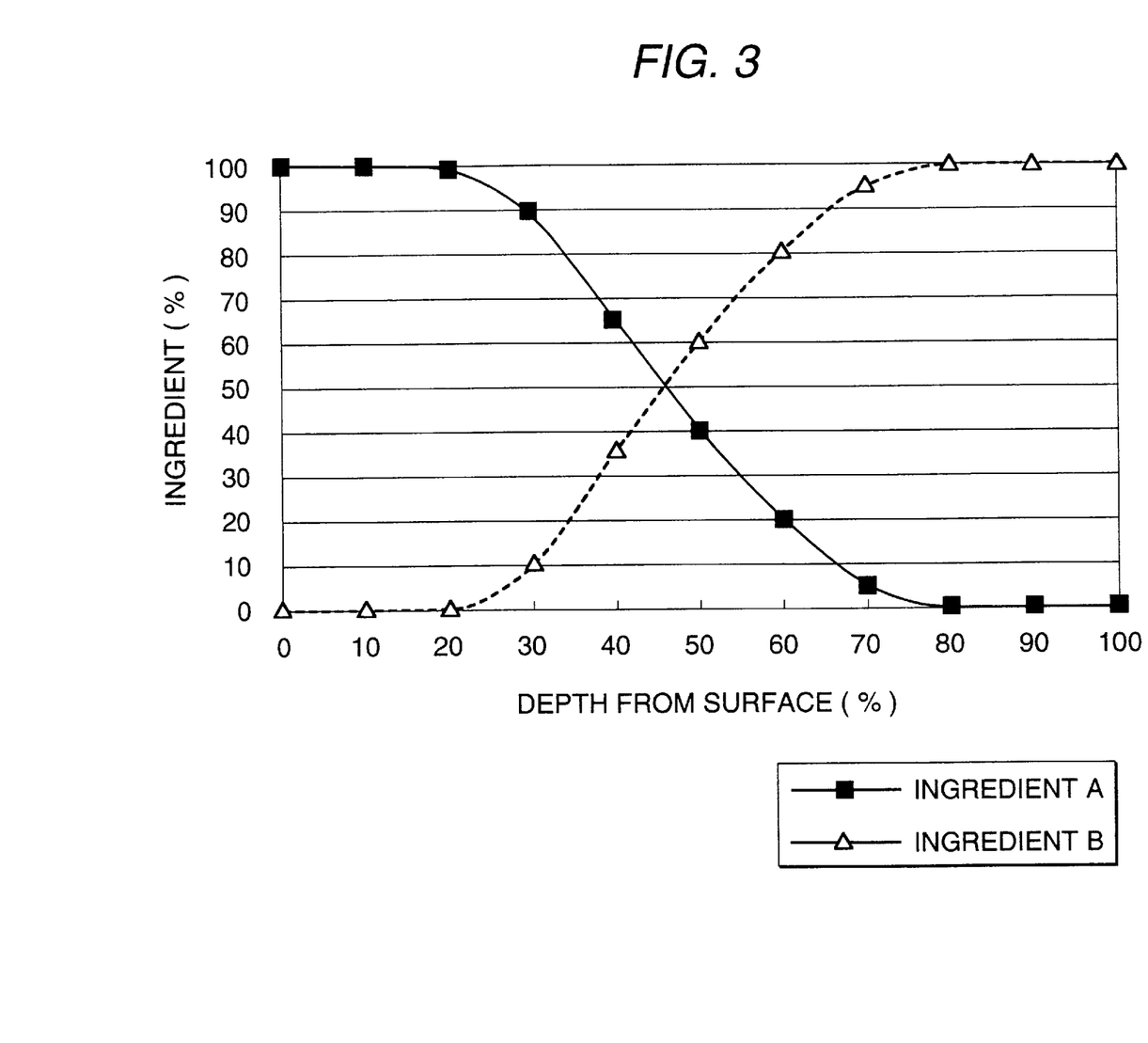
FIG. 3 is a graphic presentation illustrating a coating film obtained by the present invention which has a boundary having a compositional gradient.

FIG. 3 is a graphic presentation illustrating a coating film which is obtained by practicing the present invention and has a boundary having a compositional gradient. In this coating film, the substrate side and the surface side consist of ingredient A and ingredient B, respectively. However, the coating film has, in a thickness-direction central part thereof, a boundary layer having a continuously changing gradient with respect to the amount of each of ingredient A and ingredient B. Due to the presence of this boundary layer, the mechanical, electrical, optical, and chemical properties and other properties of the film can be continuously changed around the interface between a layer A on the surface side and a layer B on the substrate side. Furthermore, adhesion at the interface is enhanced and interfacial peeling can be prevented.

Figure 4:
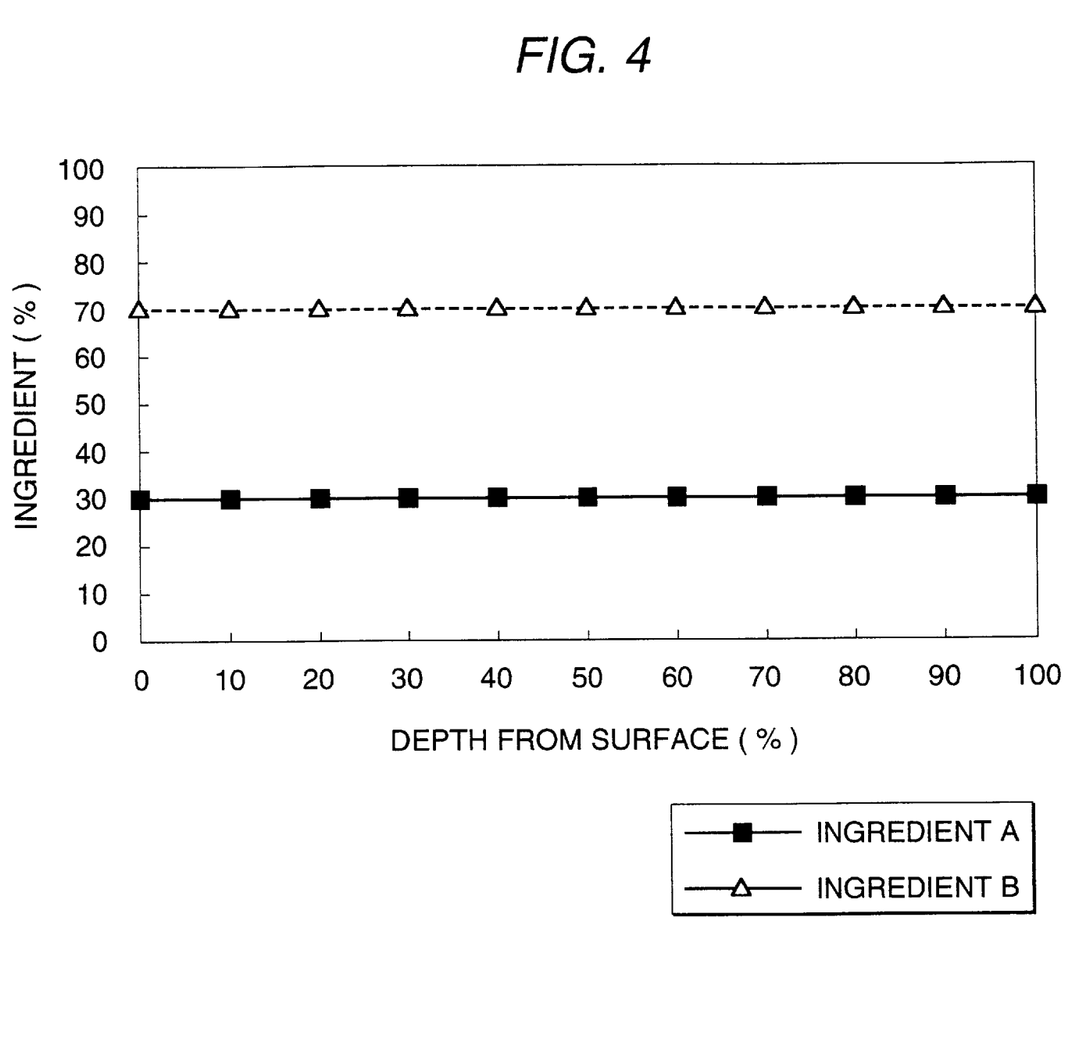
FIG. 4 is a graphic presentation illustrating a coating film obtained by the present invention which consists of mixed ingredients.

FIG. 4 is a graphic presentation illustrating a mixture film obtained by the present invention. The figure shows that the content of ingredient A and that of ingredient B in the coating film are constant in the thickness direction. In the case where a mixture film comprising ingredient A and ingredient B in a given proportion is to be deposited in the present invention, it is preferred to dispose a film thickness compensator plate in the space around the surface of at least one of the targets 2A and 2B. This is effective in regulating the proportion of the amount of each of ingredient A and ingredient B which reaches the substrate to form a coating film to the amount of each ingredient which has been ejected for sputtering. When a gas such as nitrogen or oxygen is used as a feed gas and is converted to a plasma, then an oxide or nitride can be deposited by reactive sputtering.

In the present invention, ingredient A and ingredient B may, of course, be different substances, and may also be ones which are composed of the same components but differ in composition.

The film deposition method employing planar magnetron cathodes shown in FIG. 1 is suitable for the deposition of coating films such as transparent conductive films, antistatic films, electromagnetic shielding films, and antireflection films for medium- to large-sized flat displays, transparent conductive films and antireflection films for half mirrors and solar cells, and heat shielding films, electromagnetic shielding films, and antireflection films for window glasses for use in buildings, motor vehicles, etc. The cathodes shown in FIG. 2 are suitable for use in depositing a coating film on substrates having a relatively small area.

These targets each usually has, on the back side thereof, a backing plate mainly comprising copper, a cooling mechanism for cooling the backing plate, and a reinforced magnet for magnetron constitution. These members each have been united with the target or is disposed separately therefrom.

Examples of the sputtering target materials usable in the present invention include metals, metal oxides, metal sulfides, and metal nitrides. For example, use can be made of metallic or semiconducting elements belonging to groups 2A to 6B in the third to seventh periods of the periodic table and including lanthanide elements. Specific examples thereof include indium, tin, zinc, gallium, antimony, aluminum, bismuth, titanium, zirconium, tantalum, niobium, molybdenum, lanthanum, cerium, and silicon. Targets having electrical conductivity are preferred, and those having a surface resistivity of 10 k$\Omega$/□ or lower are preferred from the standpoint of enabling a stable discharge. In the case of silicon, for example, it is preferred to obtain electrical conductivity by doping with a slight amount of boron, aluminum, or phosphorus.

The above metals (including semiconducting elements) in the periodic table can be used as target materials to deposit metal oxide films, metal oxynitride films, and metal nitride films on substrates by reactive or another sputtering. In the case where metal oxides or the like are used as targets, sinters are often used as the targets. In this case, the targets preferably have the electrical conductivity shown above. The present invention is applicable also to the formation of metal films or semiconductor films from the above metals and semiconducting elements in the periodic table.

Furthermore, the oxides, sulfides, and nitrides of the aforementioned metals can be used as targets. In this case, it is preferred to use a target in which the metal has been doped with a small amount of an impurity element whose group number in the periodic table is larger by one than the group number of that metal, as in the relationship between indium and tin in ITO, for the purpose of improving the electrical conductivity of the target surface. As a result, carriers which carry an electric current through the target generate stably and, hence, a discharge can stably occur on the sputtering target.

Examples are shown below by which the present invention can be practiced using the sputtering apparatus shown in FIG. 1, which employs two planar magnetron cathodes arranged closely.

The following film deposition conditions are preferably used.

Distance between two targets, Lc: 0.1 to 50 cm

Distance between target and substrate, Ls: 5 to 20 cm

Sputtering gas: Argon or a sputtering gas containing a small amount of oxygen is used when a metal oxide coating film is deposited using metal oxide targets; and argon containing a reactive gas, such as oxygen or nitrogen, is used as a sputtering gas when a metal oxide film or metal nitride film is deposited using metal targets.

Sputtering pressure: 1 to 20 mTorr

Substrate temperature: room temperature to 350° C.

Alternate-inversion frequency: 1 to 100 kHz

Voltage amplitude between two cathodes: 200 to 1,000 V

EXAMPLE 1

A sintered body of a mixture of indium oxide and a small proportion of tin oxide is used as a target 2A, and a sintered body of a mixture of zinc oxide and aluminum oxide is used as a target 2B. A mixed gas comprising argon and a small amount of oxygen is used to conduct sputtering simultaneously using the two targets while a glass plate as a substrate is being conveyed in one direction so as to pass in front of the targets (see FIG. 1). By this method, a coating film is obtained which has a substrate-side layer comprising ITO and a surface-side layer comprising zinc oxide containing a slight amount of aluminum and has, in a thickness-direction central part thereof, a gradient-composition boundary where the ITO content and the zinc oxide content decreases and increases, respectively, from the substrate side toward the surface side. A feature of this coating film resides in that the surface-side layer has a higher rate of etching with acids than the substrate-side layer. Consequently, the coating film, when processed into a transparent electrode for liquid crystal displays, organic electroluminescent display elements, or the like, can be patterned so as to have a section which is trapezoidal or nearly trapezoidal. Thus, an abrupt change in level due to the thickness of the transparent electrode can be avoided.

EXAMPLE 2

A sintered body of a mixture of indium oxide and a small proportion of tin oxide is used as a target 2A, and a sintered body of a mixture of tin oxide and a small proportion of antimony oxide is used as a target 2B. A mixed gas comprising argon and a small amount of oxygen is used to conduct sputtering simultaneously using the two targets while a glass plate as a substrate is being conveyed in one direction so as to pass in front of the targets. By this method, a coating film is obtained which has a substrate-side layer comprising ITO (low-resistance layer) and a surface-side layer comprising tin oxide (containing a slight amount of antimony oxide; the layer has high resistance to acids and alkalis and excellent marring resistance) and has, in a thickness-direction central part thereof, a gradient-composition boundary where the ITO content and the tin oxide content decreases and increases, respectively, from the substrate side toward the surface side. This coating film can be used as a transparent conductive film which has low electrical resistance and is less apt to suffer marring.

The method described above can be modified so as to deposit a coating film comprising superposed layers having different compositions, for example, a coating film having a substrate-side layer comprising ITO containing 5 wt % tin oxide (low-resistance layer) and a surface-side layer comprising ITO containing about 20 wt % tin oxide. Thus, a transparent conductive film is obtained which can be processed into an electrode through acid etching and has low electrical resistance, and the surface of which has high chemical resistance.

EXAMPLE 3

An alloy of barium (Ba) and strontium (Sr) is used as a target 2A, and titanium (Ti) metal is used as a target 2B. A mixed gas comprising argon and a small amount of oxygen is used to conduct sputtering simultaneously using the two targets while a substrate is being conveyed in one direction so as to pass in front to the targets. By this method, a coating film is obtained which has a substrate-side layer comprising an oxide containing barium and strontium and a surface-side layer comprising titanium oxide and has, in a thickness-direction central part thereof, a region where the composition changes continuously from the substrate side toward the surface side. The two sides of this coating film differ in dielectric characteristics. This coating film can be used as a ferroelectric film useful in memories and piezoelectric devices, wherein the ferroelectric film is required to have continuous and asymmetric dielectric characteristics.

An example of mixture films which can be deposited using the sputtering apparatus illustrated in FIG. 2, employing a disk-form cathode and a ring-form cathode, will be given below. The substrate is held stationally or rotated right over the targets. The distance between the substrate and each target is preferably about 5 cm or larger, and the distance between the two targets is preferably about from 1 to 10 mm.

TABLE 1

| Example | Target A | Target B | Cathode type | Coating film Material | Coating film Structure | Characteristic performance | Application |
|---|---|---|---|---|---|---|---|
| 1 | $In_2O_3/SnO_2$ mixture | $ZnO/Al_2O_3$ mixture | planar | oxide | gradient | processability in patterning | transparent electrode |
| 2 | $In_2O_3/SnO_2$ mixture | $SnO_2/Sb_2O_3$ mixture | planar | oxide | gradient | chemical resistance | transparent electrode |

TABLE 1-continued

| Example | Target A | Target B | Cathode type | Coating film Material | Structure | Characteristic performance | Application |
|---|---|---|---|---|---|---|---|
| 3 | Ba—Sr alloy | Ti metal | planar | oxide | gradient | asymmetric ferroelectric property | piezoelectric element |
| 4 | $In_2O_3$ | $SnO_2/Sb_2O_3$ mixture | disk/ring | oxide | mixture | compositional controllability | transparent electrode |
| 5 | $SnO_2/Sb_2O_3$ mixture | $ZnO/Al_2O_3$ mixture | planar | oxide | gradient | hardness, improved adhesion | protective film |
| 6 | Sn | Zn | planar | oxide | gradient | hardness, improved adhesion | protective film |
| 7 | Sn | Zn | planar | oxide | two-layer | hardness | protective film |
| 8 | Ti | Si | planar | oxide | gradient | continuously changing refractive index | optical film |
| 9 | Al | Si | planar | oxynitride | gradient | improved weatherability | protective film |
| 10 | 5%-$SnO_2$/95%-$In_2O_3$ mixture | 20%-$SnO_2$/80%-$In_2O_3$ mixture | planar | oxide | gradient | chemical resistance | transparent electrode |

EXAMPLE 4

An indium oxide sintered is used as an outer ring-form target 2A, and a tin oxide sintered body is used as an inner disk-form target 2B. A mixed gas comprising argon and a small amount of oxygen is used to conduct sputtering simultaneously using the two targets while a glass plate as a substrate is held so as to face the targets. Thus, a coating film comprising a mixture of indium oxide and tin oxide is deposited on the substrate. This coating film can be used as a transparent conductive film for electronic devices.

Other examples of coating films obtained by practicing the present invention are shown in Table 1 together with Examples 1 to 4. The coating films of Examples 5 to 7 are useful as dielectric layers (protective films) in electromagnetic shielding or heat shielding films formed, for example, by alternately superposing a silver film and a metal oxide film.

Example 8 is useful in producing a multilayered optical film comprising a high refractive index oxide layer and a low refractive index oxide layer superposed thereon, such as an antireflection film or a half mirror, for regulating the gradient of refractive index around the interface between the layers. An Example in which a half mirror was produced from a glass substrate using the carrousel type sputtering apparatus shown in FIG. 5 is described below in detail.

Figure 5:
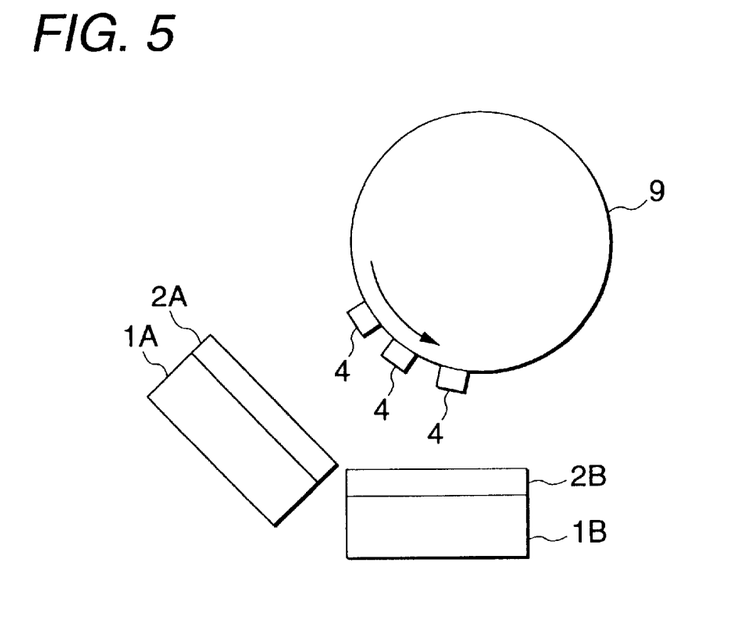
FIG. 5 is a view illustrating another embodiment of the arrangement of a pair of cathodes usable in practicing the present invention.

As shown in the diagrammatic sectional view of important parts in FIG. 5, the sputtering apparatus used has a cylindrical substrate holder 9 rotatable on an axis and two cathodes 1A and 1B. The cathodes 1A and 1B each has a rectangular surface to which a target is to be bonded, and have been arranged so that these bonding surfaces face the substrate holder 9 and are parallel to the periphery thereof. In this Example, titanium metal and silicon were used as the target 2A and the target 2B, respectively. An argon/oxygen mixed gas was used as a sputtering gas. The sputtering mode was set to the oxygen-reactive mode so as to deposit a titanium dioxide film and a silicon dioxide film respectively from the two targets onto glass substrates. Such conditions included a sputtering atmosphere pressure of 0.4 Pa and a sputtering gas composition comprising 80 vol % oxygen and 20 vol % argon. During the coating film deposition, the substrate holder 9 was rotated at a constant speed.

Figure 6:
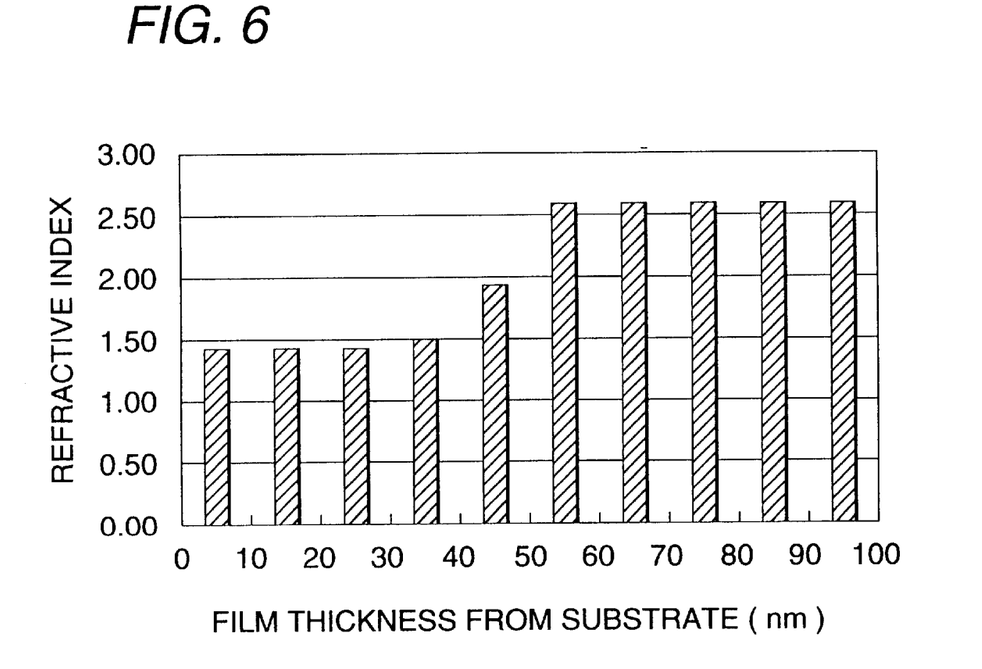
FIG. 6 is a graphic presentation illustrating the thickness-direction refractive index distribution of the coating film of a half mirror obtained by practicing the present invention.

As the substrates were used glass plates having a refractive index of 1.52. A coating film having a thickness of 100 nm was deposited on a surface of each glass plate. The voltage applied to each target was changed during the deposition so that the content of silicon dioxide and that of titanium dioxide in the film deposited had a gradient in the thickness direction. In this Example, the coating film was deposited so that the layer thereof ranging from the glass plate surface to a distance of 30 nm from the surface consisted substantially of silicon dioxide and the layer thereof ranging from 50 nm to 100 nm in terms of distance from the glass plate surface consisted substantially of titanium dioxide, and that the intermediate region ranging from 30 to 50 nm in terms of distance from the glass plate surface had a compositional gradient in the thickness direction. In FIG. 6 is shown a refractive index distribution in the thickness direction.

Figure 7:
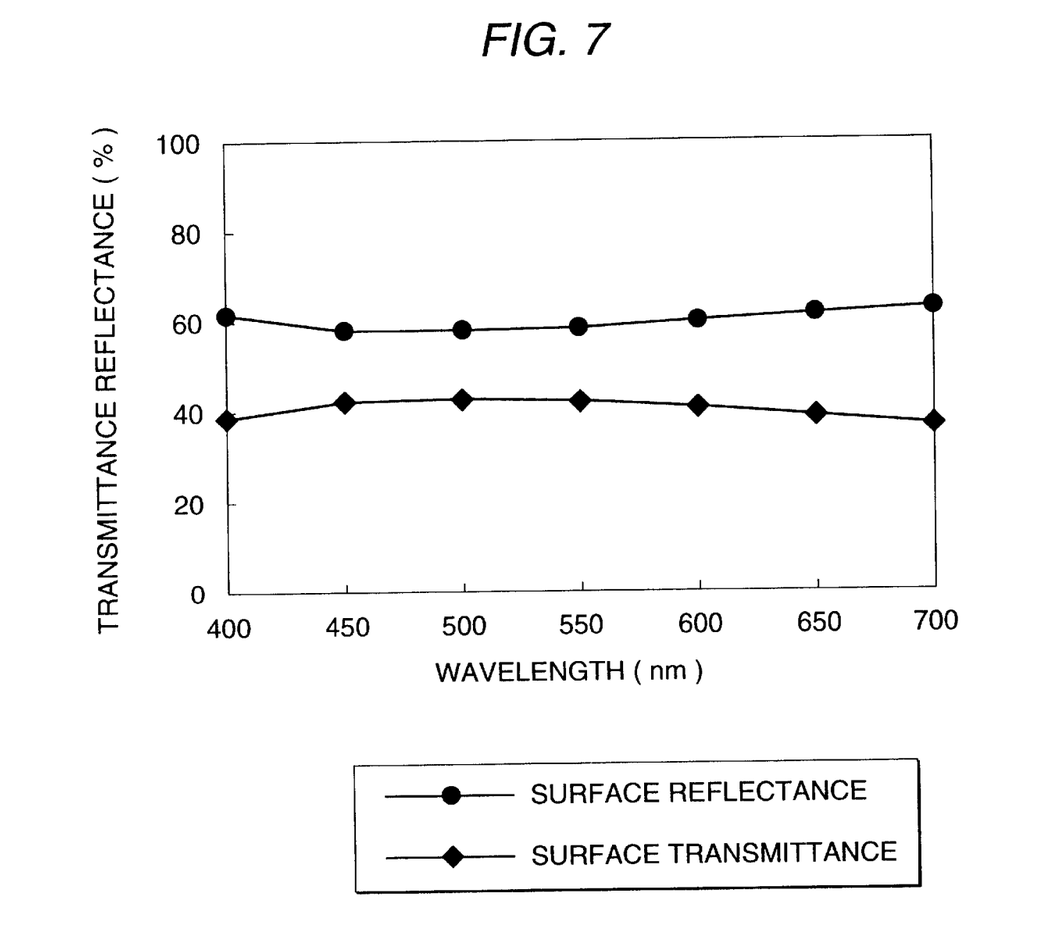
FIG. 7 is a graphic presentation illustrating the spectral reflectance and transmittance of the half mirror obtained by practicing the present invention.

In FIG. 7 are shown the spectral transmittance and reflectance of the film-coated glass plates obtained. A half mirror whose reflectance and transmittance were about 40% and about 60%, respectively, in the visible region, i.e., nearly constant in the visible region, was obtained. This half mirror is useful, for example, as the back substrate of a reflection type liquid-crystal display element. According to the present invention, such an optical film can be obtained as a single-layer film.

Example 9 is useful for obtaining a protective film having a continuous compositional gradient (passivation film) by superposing different materials. An example of a coating film composed of superposed layers differing in composition is shown as Example 10.

According to the present invention, coating film deposition on a substrate surface is conducted by a method comprising closely arranging a pair of cathodes, applying a negative voltage thereto while alternately inverting the polarities thereof so that when one of the cathodes is used as a negative or positive electrode, then the other cathode is used as a positive or negative electrode, respectively, to generate glow discharges on targets respectively disposed on the two cathodes, and simultaneously bombarding the targets with positive ions resulting from the glow discharges to thereby sputter a coating film on a surface of a substrate, wherein the material or composition of the target disposed on one of the cathodes differs from that of the target disposed on the other cathode and the film deposited on the substrate surface comprises both of the target materials or compositions. This method can stably and continuously deposit at a high rate a coating film having a boundary having a compositional gradient in the thickness direction, a coating film comprising a mixture of the two ingredients, or a coating film having a multilayer constitution comprising superposed layers of the respective ingredients.

When planar cathodes are used as the two cathodes, a coating film having a boundary having a compositional gradient, a two-layer film having high adhesion, or a coating film comprising a mixture of the two ingredients can be easily deposited on a substrate having a large area, by conducting film deposition while the substrate is passed in front of the cathodes so as to cross the cathodes.

Furthermore, when a pair of cathodes in which one is surrounded by the other is used as the two cathodes, a coating film comprising a mixture of target ingredients can be easily deposited at a low equipment cost.

What is claimed is:

1. A method of film deposition on a substrate surface which comprises closely arranging a pair of cathodes in a vacuum apparatus in which an atmosphere having a reduced pressure can be prepared, applying a voltage thereto while alternately inverting the polarities thereof so that when one of the cathodes is used as a negative or positive electrode, then the other cathode is used as a positive or negative electrode, respectively, to generate glow discharges on targets respectively disposed on the two cathodes, and simultaneously bombarding the targets with positive ions resulting from the glow discharges to thereby sputter a coating film comprising the materials of the targets on a surface of a substrate, wherein (a) the material of the target disposed on one of the cathodes differs from that of the target disposed on the other cathode and the film deposited on the substrate surface comprises both of the target materials and (b) the two cathodes are arranged so that one is surrounded by the other, whereby the different target materials in the coating film deposited are present as a mixture of both.

2. The method of film deposition on a substrate surface of claim 1, wherein the target materials each is a metal.

3. The method of film deposition on a substrate surface of claim 1, wherein the target materials each is an electroconductive metal oxide.

* * * * *